(12) United States Patent
Wood et al.

(10) Patent No.: US 6,929,869 B1
(45) Date of Patent: Aug. 16, 2005

(54) ORGANIC LIGHT EMITTING MATERIAL AND DEVICE

(75) Inventors: Emma L Wood, Malvern (GB); Ian C Sage, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/831,724

(22) PCT Filed: Dec. 6, 1999

(86) PCT No.: PCT/GB99/04099

§ 371 (c)(1),
(2), (4) Date: May 15, 2001

(87) PCT Pub. No.: WO00/35092

PCT Pub. Date: Jul. 15, 2000

(30) Foreign Application Priority Data

Dec. 8, 1998 (GB) .................................. 9826845

(51) Int. Cl.$^7$ ............................................. H05B 33/14
(52) U.S. Cl. ...................... 428/690; 428/917; 313/504; 313/506
(58) Field of Search ................ 428/690, 917; 313/504, 506

(56) References Cited

U.S. PATENT DOCUMENTS

| | | | |
|---|---|---|---|
| 4,916,711 A | 4/1990 | Boyer et al. | |
| 5,187,288 A | 2/1993 | Kang et al. | 548/110 |
| 5,189,029 A | 2/1993 | Boyer et al. | 514/64 |
| 5,281,489 A * | 1/1994 | Mori et al. | 428/690 |
| 5,433,896 A | 7/1995 | Kang et al. | 252/700 |
| 5,446,157 A | 8/1995 | Morgan et al. | 546/13 |
| 5,677,572 A | 10/1997 | Hung et al. | 257/750 |

FOREIGN PATENT DOCUMENTS

| | | |
|---|---|---|
| DD | 265266 A1 * | 2/1989 |
| JP | 9-289081 | 11/1997 |
| WO | WO97/32452 | 9/1997 |

OTHER PUBLICATIONS

English language translation of JP 9-289081 (Nov. 1997).*
Czerney et al., "New Laser Dyes for the 400-800 nm Region", Applied Fluorescence Technology vol. 1, Jun. 1989, pp. 13-14.*
Daub J et al.: "Electrochemiluminescence and efficient light emitting diodes on multifunctional dyes: Donor/acceptor substituted stilbenoids and difluoroboradiaza-s-indacenes" proceedings of the 1997 ACS San Francisco Meeting; San Francisco, CA, USA Apr. 1997, vol. 38, No. 1, pp. 339-340, Polym Prepr Div Polym Chem Am Chem Soc; Polymer Preprints, Divison of Polymer Chemistry, American Chemical Society Apr. 1997 ACS, Washington, DC, USA.
Patent Abstracts of Japan vol. 1998, No. 03, Feb. 1998 & JP09 289081 (Mitsubishi Chem Corp), Nov. 1997.
Dodabalapur, "Organic Light Emitting Diodes", Solid State Communications, vol. 102, No. 2-3, pp. 259-267, 1997.

* cited by examiner

Primary Examiner—Marie Yamnitzky
(74) Attorney, Agent, or Firm—Nixon & Vanderhye P.C.

(57) ABSTRACT

Organic light emitting diode devices having a substrate bearing an organic layer sandwiched between electrode structures. The organic layer includes, in a single layer a hole transporter, an electron transporter and a light emitter where the electron transporter or the light emitter or the electron transporter and the light emitter include a material of general formula 1.

13 Claims, 3 Drawing Sheets

ORGANIC LIGHT EMITTING MATERIAL AND DEVICE

This invention concerns new compositions and the use of such compositions in organic semi-conductor devices for example organic light emitting devices. In particular it relates to the use of luminescent boron fluoride complexes as a component of organic luminescent devices.

The use of organic electrically conducting materials as semiconductors in the fabrication of electronic devices has been explored by many investigators. Light emitting diodes have been demonstrated using a wide range of organic and molecular solids, including N,N'-diphenyl-N,N'-ditolylbenzidine, aluminium tris 8-hydroxyquinolinate, 3-biphenyl-5-(4-t-butylphenyl)oxadiazole and poly(phenylene vinylene).

Conduction in organic semiconductors may be regarded as a two stage process. In the first stage, charge is injected into the organic material from the metal electrode. An example is injection of charge into evaporated thin films of 3-biphenyl-5-(4-t-butylphenyl) oxadiazole from a low work function electrode such as a magnesium metal electrode by application of a negative potential to the electrode. This injection of charge may also be regarded as an electrochemical reduction of the conducting material, or as electrochemical doping of the material. Other electronically conducting organic compounds may be subjected to charge injection by a positive potential, which is commonly applied via an electrode composed of a high work function metal such as gold. Such charge injection is commonly described as injection of positive charges denoted holes, and this description is understood to be equivalent to the extraction of electrons from the conducting material, which may also be regarded as an electrochemical doping or oxidation of the organic semiconductor.

In the second stage, charge is transported through the organic semiconductor layer. Conduction within electronically conducting organic solids involves, in practical materials, the transfer of electrical charge from one molecule to another. Such transfer of charge is described by a charge hopping or charge tunnelling mechanism which may allow an electron to overcome the energetic barrier between different molecules or molecular subunits. In systems such as conjugated polymers including poly(acetylene) and poly(phenylenevinylene) charge can also flow along the conjugated chain by movement of charged discontinuities in the regular bonding sequence of the polymer. In such cases, charge will normally be transferred through the bulk sample by a large number of individual molecules, and hopping or tunnelling remains an important mechanism.

In order to achieve efficient light emission from an organic electroluminescent device, it is desirable for respectively positively charged and negatively charged carriers to become simultaneously localised on a single molecule or on a small number of molecules in mutual close proximity. Such localisation of oppositely charged carriers leads to production of a molecule in its excited state, or to an eximer or exciplex comprising a plurality of molecules in an electronically excited state. Such electronically excited species, especially in the case of conjugated polymers, may also be termed exciton states.

Localisation of respectively positive and negative charge carriers may be achieved in several ways. By virtue of their opposite electronic charges, a coulombic attraction exists between them which tends to lead to localisation. Under the high electric field gradients typical of an operating device, such localisation may be ineffective in achieving high operating efficiency from devices. A known route to achieving high efficiency in devices is to use two organic semiconductor layers, one of which transports only positive carriers (holes) and the other transports only negative carriers (electrons). Under operating conditions, a high density of carriers of each sign is deposited at the interface or junction formed by the two layers, increasing the probability of their combination to form an electronically excited state. Such devices can show high efficiency but suffer the disadvantage that they require fabrication of a multilayer organic structure. Single layer structures may admit the passage of both electron and holes. Improved efficiency of operation in such single layer devices can be obtained by including in the composition a luminescent material (i.e. a dopant) at low concentration, preferably selected as having both an electron affinity higher than that of the principal negative charge carrying species in the semiconductor, and an ionisation potential lower than that of the principal positive charge carrying species in the layer. Under this condition, the luminescent material traps injected charge carriers of each polarity, increasing the probability of their combination.

The electronically excited states obtained by combination of charge carriers may be obtained in conditions of different total electronic spin, especially in so-called singlet states and triplet states respectively. It is understood that in order to obtain high luminescence efficiency, the singlet states of excited species are most effective in many cases due to the possibility of their radiative decay to an electronic ground state with emission of a photon of light by a quantum mechanically allowed transition (fluorescence). In favourable cases, emission of light from such a singlet state occurs with high efficiency.

It is known that other routes exist by which the energy may be lost from an excited state, without emission of a photon of light. Non-radiative decay results in conversion of the energy to heat within the material. In most organic materials, non-radiative decay is the usual route to loss of energy from excited triplet states, as well as being a competitive process to the desirable fluorescence. A further route to loss of energy from an excited singlet state is its transition to a triplet state, followed by non-radiative decay. It is desirable in many practical devices that both direct non-radiative decay routes and the transformation of singlet states to triplet states should be minimised to achieve the highest efficiency in the device.

Some of the compounds described by the current invention are known to show high luminescence efficiency and stability, and to provide a low probability of crossing from an excited singlet state to a triplet state. In addition some of the compounds of formula I have been proposed, for example as laser dyes, and a number of compounds described by the present invention are offered commercially for this purpose.

Dodabalapur in Solid State Communications, vol 102, No2–3, pp 259–267, 1997 describes the use of a pyrromethene in combination with Alq3 wherein the commercially available pyrromethene PM580 is present as a dopant (which may also be referred to as a light emitter) and the Alq3 is an electron transporter. In this case, no particular benefit is revealed from the use of PM580 against the known incorporation of luminescent materials such as rubrene, coumarin 6 and quinacridone derivatives into Alq3 layers in such devices. Such a route to device fabrication necessitates the use of a co-evaporation of Alq3 and dopant which requires complex facilities for its success and/or is difficult to control in practise.

Japanese patent Kokai number 9-289081 describe the use of $BF_2$— containing compounds in organic electroluminescent devices. Those devices comprise an anode, a hole transport layer, an organic electron transport layer and a cathode stacked in succession where the hole transport layer and/or organic electron transport layer contain(s) a pyrromethane-$BF_2$ complex. In addressing the problems of the prior art, the invention disclosed in JP 9-289081 aims to provide devices whose light emission spectra have a small half maximum full-width—i.e. a narrow emission spectrum thus leading to some control of the colour produced.

Up until now it has proved difficult to provide single layer OLED devices without compromising the overall performance—in particular the brightness and efficiency.

It has unexpectedly been found that compounds of the present invention show advantageous properties in respect of their ability to act as radiative combination sites for charges in organic electroluminescent structures and as electron transporting layers in OLEDs.

According to this invention an organic light emitting diode device comprises a substrate bearing an organic layer sandwiched between electrode structures wherein the organic layer comprises a hole transporter, an electron transporter and a light emitter wherein the electron transporter or the light emitter or the electron transporter and the light emitter comprise a material of general formula I:

Formula I wherein

is selected from the following:

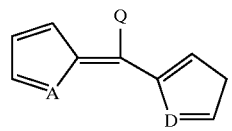

wherein A and D are both N, and the ring systems are, independently of each other, optionally substituted with one or two or three groups independently selected from C1–C8 straight chain or branched chain alkyl or alkoxy; Q is CN or H or $C_{1-8}$ straight chain or branched chain alkyl;

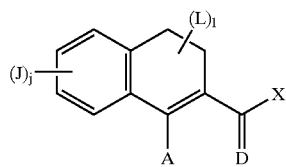

wherein A and D are given by O or N, X is given by $C_{1-5}$ straight chain or branched chain alkyl or alkoxy and the ring systems are, independently of each other, optionally substituted with one or more groups J and L independently selected from C1–C8 straight chain or branched chain alkyl or alkoxy wherein j is selected from 0–4 and l is selected from 0–2;

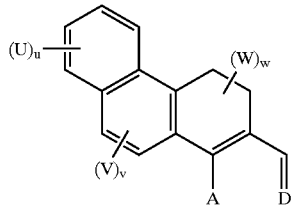

wherein A and D are given by O or N and the ring systems are, independently of each other, optionally substituted with one or more groups U, V, W independently selected from C1–C8 straight chain or branched chain alkyl or alkoxy wherein u is 0–4, v is 0–2 and w is 0–2;

characterised in that the organic layer is a single layer.

By stating that the organic layer is a single layer it is meant that the electron transport, hole transport and light emitting functions are provided by a single layer.

Optionally there may be a layer (i.e. an electrode modifying layer) between one of the electrodes and the organic layer. This layer is preferably an organic material and comprises examples of known materials such as copper phthalocyanine (CuPc), polyaniline, PEDOT wherein PEDOT is the following:

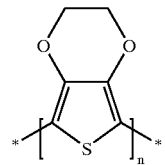

doped with polystyrene sulphonic acid.

Preferably the organic electrode modifying layer is the layer closest to the substrate—in turn the electrode which it is adjacent to is preferably the anode. The function of the electrode modifying layer includes assistance of hole injection and planarisation of the anode. A further function of the electrode modifying layer may include inhibition of diffusion of material, eg., oxygen or indium, from the electrode into the organic layer.

Optionally, in addition or alternatively, there may be present a layer of an electrode modifying layer between the organic layer and the other electrode which is usually furthest from the substrate—i.e. usually the cathode; this is preferably an inorganic layer and examples include LiF and $MgF_2$. This layer assists in electron injection.

In general the electrode modifying layers may be conducting or insulating.

Preferably the electrode furthest from the substrate is the cathode and preferably it comprises Al or an Al alloy or Mg or MgAg.

Preferably the electrode closest to the substrate is the anode.

Preferably the organic layer further comprises a semiconducting polymer e.g. polyvinylcarbazole. In addition or instead of the semiconducting polymer there may be one or more dispersed charge transporting compounds present.

Alternatively, rather than a semiconducting polymer being present there may be an electronically inert polymer present (i.e. one that is substantially non-conducting) in which case there is also present one or more charge transporting compounds.

According to a further aspect of this invention a composition suitable for use as an organic layer in an OLED device comprises a material of general formula I.

Compounds of Formula I show advantageous combinations of properties when used in organic light emitting devices.

The structural and other preferences are expressed below on the basis of desirable characteristics, in particular an advantageous combination of electronic orbital energy levels which is one factor determining the effectiveness of capture and recombination of electronic charge carriers in a light emitting device, luminescence quantum efficiency, solubility, processability and high chemical and photochemical stability of the material in storage and in operating devices. The present invention may give rise to devices which exhibit, inter alia, one or more of the following advantages—higher brightness, higher efficiency, purer spectral colours, longer operating life, lower cost of manufacture.

Preferably the compounds of formula I are present as:
1. light emitters
2. electron transporters and light emitters.

Preferred materials of Formula 1 include boron fluoride adducts of pyrromethenes and of diketones, di-imines and ketoimines.

Advantages associated with single layer devices are the ease of fabrication and lower costs. Also single layer devices allow for solution processing without the necessity of using materials with orthogonal solvent properties.

Overall preferred structures for formula I are those listed below:
1,2,3,5,6,7-hexamethyl-8-cyanopyrromethene-difluoroborate complex
1,3,5,7,8-pentamethyl-2,6-di-t-butylpyrromethene-difluoroborate
1,3,5,7,8-pentamethyl-2,6-di-n-butylpyrromethene-difluoroborate
1,3,5,7,8-pentamethyl-2,6-diethylpyrromethene-difluoroborate
1,3,5,7,8-pentamethylpyrromethene-difluoroborate
1-(1-(difluoroboryl)oxy-3,4-dihydro-naphthalen-2-yl)-ethanone
1-(1-(difluoroboryl)oxy-3,4-dihydro-6-methoxy-naphthalen-2-yl)-ethanone
1-(1-(difluoroboryl)oxy-3H-benzo(f)chromen-2-yl)-ethanone Compounds of Formula I may be prepared by known routes, including those described in U.S. Pat. Nos. 4,916,711 and 5,189,029. Typically said preparative routes comprise reaction of boron trifluoride with a diketone, diimide or ketoimide. Routes to these compounds are well known in the art.

The invention will now be described with reference to the following diagrams by way of example only:

Unless otherwise stated all reagents used are commercially available from the Aldrich Chemical Company.

The following compounds are illustrative examples which have been synthesised according to the present invention:

EXAMPLE 1

A solution was prepared containing 0.2 g N,N'-diphenyl-N,N'-di-3-tolylbenzidine purchased from Syntec Gmbh of Industriepark Wolfen-Thalheim, Werkstattstrasse 188, 06766-Wolfen, Germany, 0.2 g 2-(4-t-butylphenyl)-5-biphenylyl-1,3,4-oxadiazole, 0.2 g poly-N-vinylcarbazole and 0.00016 g of 1,3,5,7,8-pentamethyl-2,6-di-n-butylpyrromethene-difluoroborate in 6.5 g of 1,2-dichlorobenzene. 1,3,5,7,8-pentamethyl-2,6-di-n-butylpyrromethene-difluoroborate was purchased as laser dye PM580 from AG Electro-Optics, Farside House. Tarporley Business Centre, Tarporley, Cheshire. A 2 inch square piece of ITO coated glass (Balzers, 100 $\Omega$/sq) was cleaned by rinsing in acetone and isopropanol, then spin coated with the above solution at 1000 rpm for 30 seconds. The coated glass was immediately transferred to a heated plate at 90° C. and dried for 5 minutes, then heated at 90° C. in an oven for 30 minutes. The plate was transferred to a vacuum coating apparatus and aluminium was deposited onto the polymer through a perforated metal mask to form a pattern of circular aluminium contacts 3.5 mm across with a thickness of 1000 Å at a rate of 4 Å/second at a pressure of $10^{-6}$ torr. After coating, the device was removed from the coating equipment and electrical contact made to the ITO glass by means of a wire attached by indium solder.

A gold wire was used to make electrical contact to each of the aluminium contact pads, and a negative potential applied. Light emission could be easily observed from the ITO glass side of the device.

Figure 3:
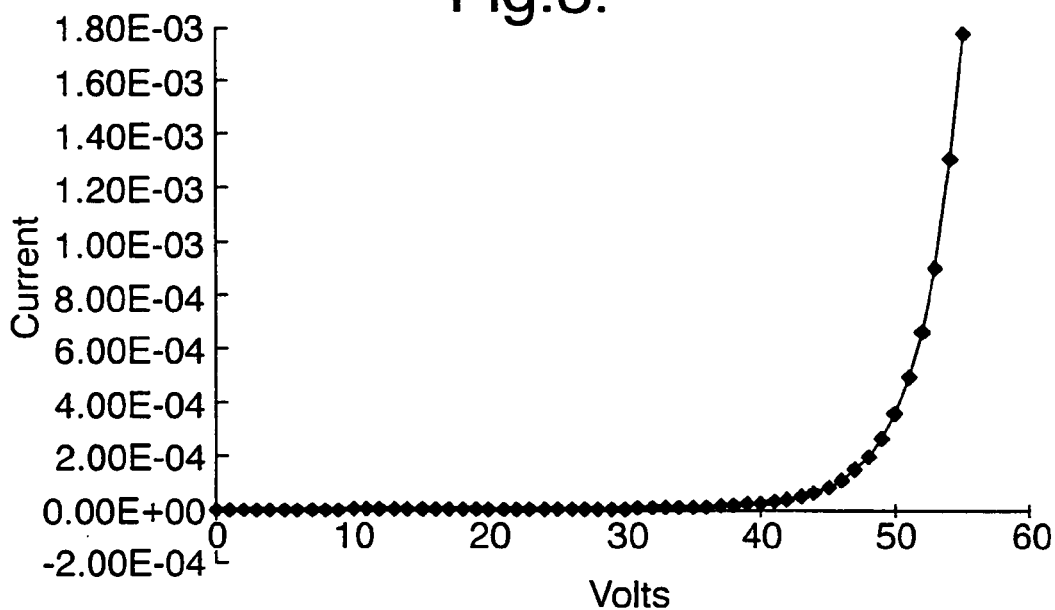
FIG. 3 illustrates the variation of current passed as a function of applied voltage by a device given by FIG. 1—see Example 1.
Figure 4:
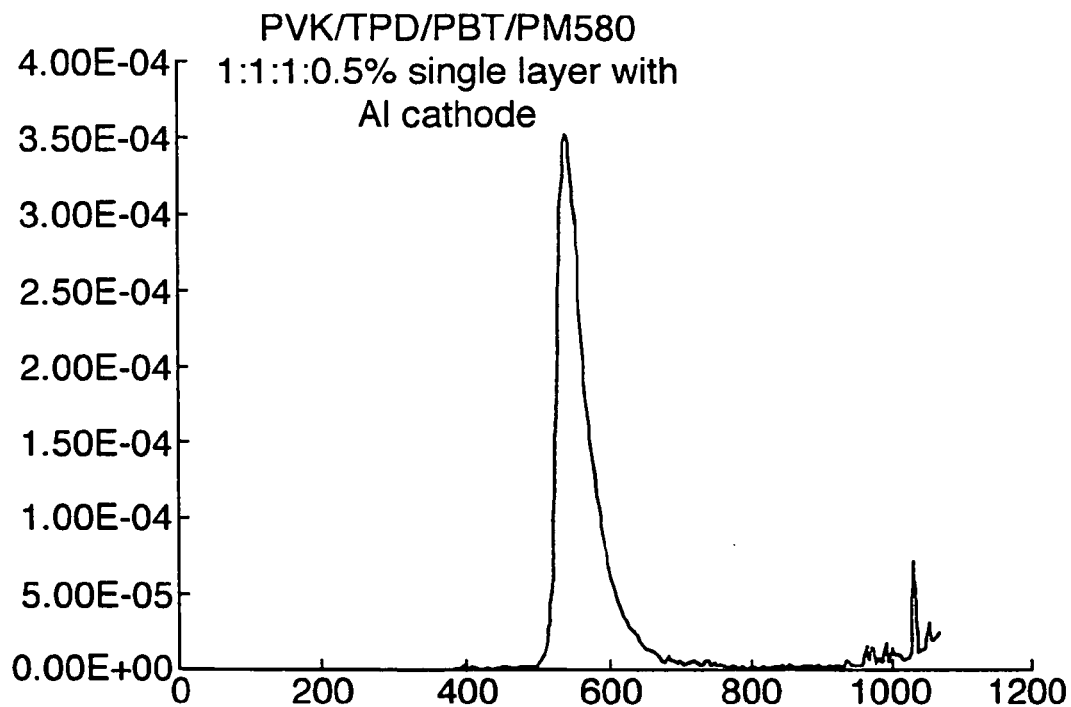
FIG. 4 illustrates the spectrum of emitted light corresponding to Example 1.

A Keithley 236 source measure unit was used to measure the variation of current passed by a sample device as a function of applied voltage. The results are shown in FIG. 3. The spectrum of the emitted light was measured by means of a Photo Research type 714 spot photometer, and is shown in FIG. 4.

EXAMPLE 2

Figure 5:
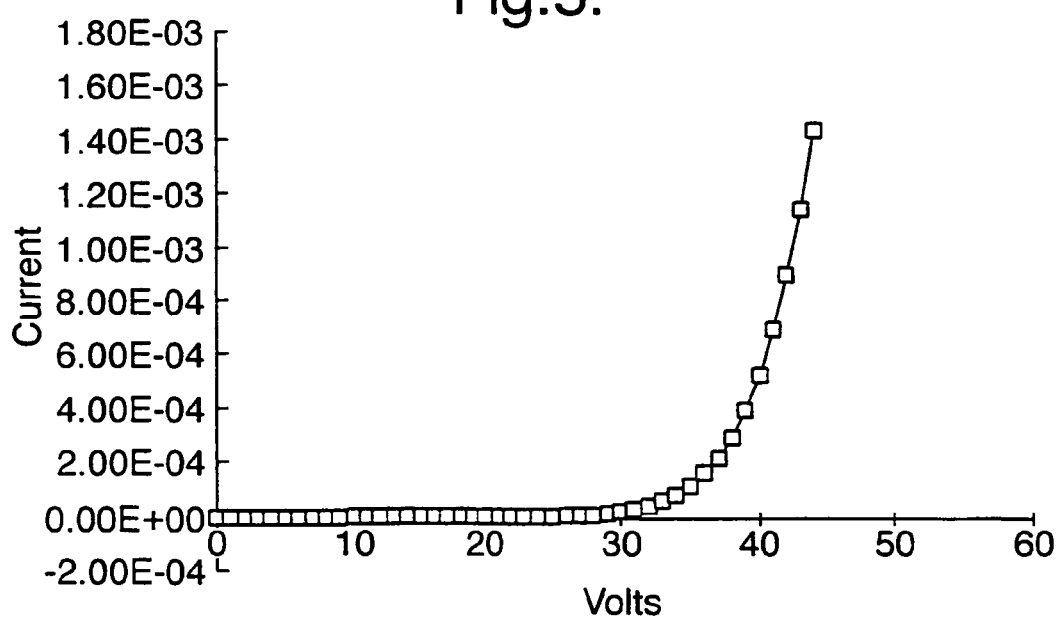
FIG. 5 illustrates the variation of current passed as a function of applied voltage by a device given by FIG. 1—see Example 2.

A device was prepared in the same manner and using identical conditions to those employed in Example 1, save that the metal contacts were formed from thermally evaporated samarium instead of aluminium. The variation of current passed by a sample device as a function of applied voltage is presented in FIG. 5. The emission spectrum was essentially identical to that shown in FIG. 4 for the device of Example 1.

EXAMPLE 3

A solution was prepared containing 0.2 g 2-(4-t-butylphenyl)-5-biphenylyl-1,3,4-oxadiazole, 0.4 g poly-N-vinylcarbazole and 0.00018 g of 1,2,3,5,6,7-hexamethyl-8-cyanopyrromethene-difluoroborate complex in 6.5 g of 1,2- dichlorobenzene. 1,2,3,5,6,7-hexamethyl-8-cyanopyrromethene-difluoroborate complex was purchased as laser dye PM650 from AG Electro-Optics, Farside House, Tarporley Business Centre, Tarporley, Cheshire. The solution was used in the fabrication of a light emitting device in the same manner as Example 2.

On application of a negative potential of 40V to the samarium contacts, emission of deep red light was visible.

Figure 1:
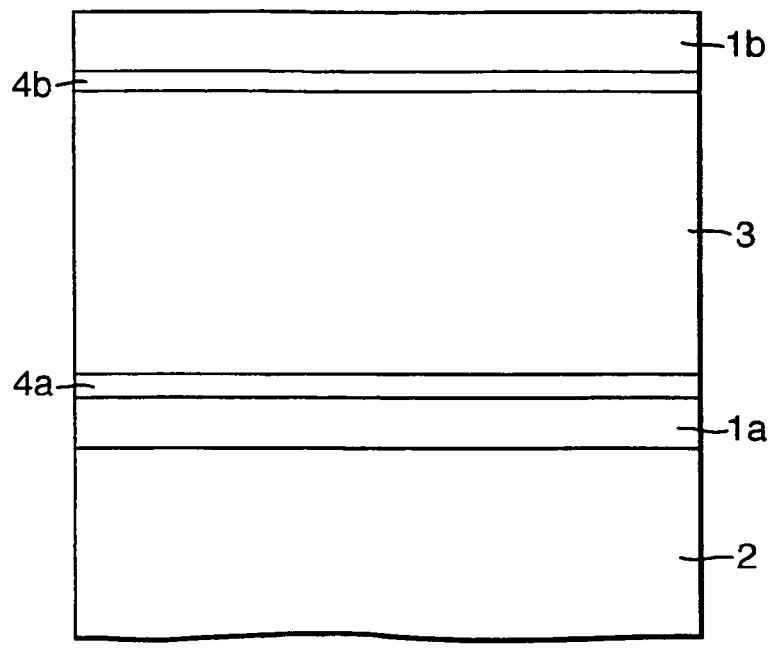
FIG. 1 illustrates an Organic Light Emitting Diode (OLED) device incorporating the materials of the present invention.

An Organic Light Emitting Diode (OLED), which is a type of semiconductor device, suitable for incorporating materials of the present invention is illustrated in FIG. 1. The device comprises two electrodes 1a, 1b, at least one of the electrodes is transparent to light of the emission wavelength of a layer of organic material 3. The other electrode may be a metal, for example Mg, Li, Ca, Al or an alloy of metals, for example MgAg, LiAl or a double metal layer, for example Li and Al or Indium Tin Oxide (ITO). One or both electrodes 1a, 1b may consist of organic conducting layers. A processing surface or substrate 2 may be made of any material which is flat enough to allow subsequent processing, for example glass, silicon, plastic. The substrate 2 may be transparent to the emitted radiation of the organic material 3. Alternatively one of the electrodes 1a, 1b may be transparent instead. If electrode 1a is transparent then preferably the substrate is transparent too. Sandwiched between the electrodes 1a and 1b is a layer of organic material 3 which consists of one layer. The layer of organic material 3 possesses the following three properties: electron transporting (ET); hole transporting (HT); light emitting (LE). The materials described by the current invention are suitable for use as electron transporters and/or light emitters. The organic material may consist of a single material, or of two or more materials with appropriate properties mixed together. Suitable hole and/or electron transport materials include conjugated polymers such as polyphenylenevinylene (PPV) or MEHPPV, amine derivatives such as triphenylamine or TPD, heterocyclic compounds such as diphenyloxadiazole and triphenyltriazole, and heterocyclic polymers such as poly(pyridine).

The LE material may act as a dopant in small quantities—typically 0.5% into ET or HT or both.

Preferably the luminescent material has a high quantum efficiency of luminescence.

The layer of organic material 3 may be deposited on the electrode 1a by any of the following techniques: thermal evaporation under vacuum, sputtering, chemical vapour deposition, spin depositing from solution or other conventional thin film technology. The thickness of the layer of organic material 3 is typically 10–1000 nm, preferably 20–200 nm.

The device may contain layers 4a and 4b (electrode modifying layers) which are situated next to the electrodes 1a and 1b, these layers 4a and 4b may be conducting or insulating and act as a barrier to diffusion of the electrode material or as a barrier to chemical reaction at the electrode 1a, 1b and layer of organic material 3 interface. Examples of suitable materials for 4a and 4b include emeraldine which prevents indium diffusion into the layer of organic material 3 from an ITO electrode, or, for the same reason, copper phthalocyanine may be used; alternatively the addition of a thin layer (~0.5 nm) of lithium or magnesium fluoride at the interface between a metal electrode and the layer of organic material 3 may be used.

Figure 2:
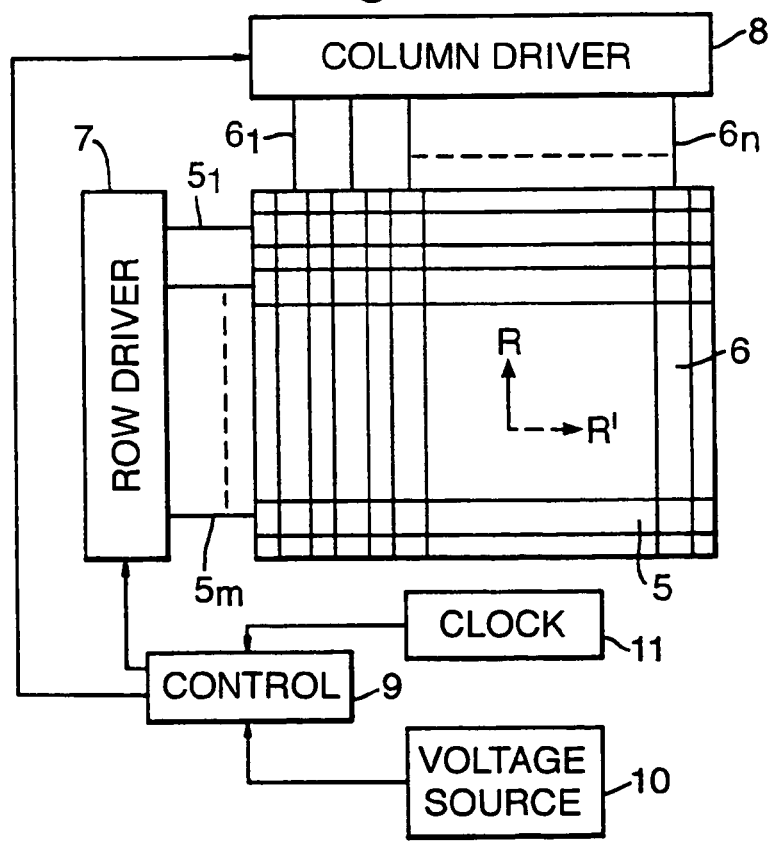
FIG. 2 illustrates a matrix addressed OLED in plan view.

The device of FIG. 1 may be a singe pixel device or it may be matrix addressed. An example of a matrix addressed OLED is shown in plan view in FIG. 2. The display of FIG. 2 has the internal structure described in FIG. 1 but the substrate electrode 5 is split into strip-like rows 5l to 5m and similar column electrodes 6l to 6n, this forms an m×n matrix of addressable elements or pixels. Each pixel is formed by the intersection of a row and column electrode.

A row driver 7 supplies voltage to each row electrode 5. Similarly, a column driver 8 supplies voltage to each column electrode. Control of applied voltages is from a control logic 9 which receives power from a voltage source 10 and timing from a clock 11.

Alternatively the device may be a multi-pixel device with each pixel addressed independently by a separate electrical connection or by an active matrix backplane.

What is claimed is:

1. An organic light emitting diode device comprising a substrate bearing a layer structure between an anode and a cathode, wherein said layer structure consists of a single organic layer, optionally an electrode modifying layer between the single organic layer and the anode, and optionally an inorganic electrode modifying layer between the single organic layer and the cathode, wherein the single organic layer comprises a hole transporter, an electron transporter and a light emitter and wherein a compound is present in the single organic layer, which compound acts as an electron transporter and light emitter and is of general Formula I:

Formula I

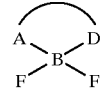

wherein

is selected from the following:

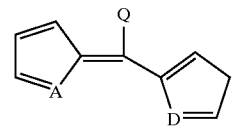

wherein A and D are both N, and the ring systems are, independently of each other, optionally substituted with one or two or three groups independently selected from C1–C8 straight chain or branched chain alkyl or alkoxy; Q is CN or H or $C_{1-8}$ straight chain or branched chain alkyl;

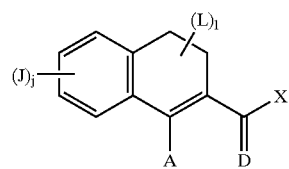

wherein A and D are O or N, X is $C_{1-5}$ straight chain or branched chain alkyl or alkoxy and the ring systems are, independently of each other, optionally substituted with one or more groups J and L independently selected from C1–C8 straight chain or branched chain alkyl or alkoxy wherein j is selected from 0–4 and l is selected from 0–2;

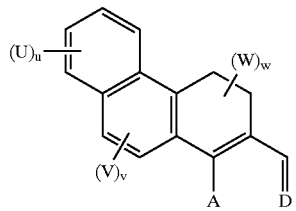

wherein A and D are O or N and the ring systems are, independently of each other, optionally substituted with one or more groups U, V, W independently selected from C1–C8 straight chain or branched chain alkyl or alkoxy wherein u is 0–4, v is 0–2 and w is 0–2.

2. A device according to claim 1 wherein at least one of the anode and the cathode has an electrode modifying layer at the electrode/organic layer interface.

3. A device according to claim 2 wherein there are electrode modifying layers at both electrode/organic layer interfaces.

4. A device according to claim 2 wherein the anode is the electrode closest to the substrate.

5. A device according to claim 1 wherein there is an electrode modifying layer adjacent to the anode comprising either PEDOT or polyaniline.

6. A device according to claim 2 wherein the cathode is the electrode furthest from the substrate.

7. A device according to claim 1 wherein there is an inorganic electrode modifying layer adjacent to the cathode comprising either $MgF_2$ or LiF.

8. A device according to claim 1 wherein the cathode is made from Al, Al alloy, Mg or MgAg.

9. A device according to claim 1 wherein the organic layer additionally includes a semi-conducting polymer.

10. A device according to claim 1 wherein the organic layer additionally includes at least a further one of a hole transporter, an electron transporter or a light emitter.

11. A device according to claim 1 wherein the organic layer further additionally includes a substantially non-conducting polymer and at least one of a further hole transporter, an electron transporter or a light emitter.

12. An organic light emitting diode device comprising a substrate bearing a layer structure between an anode and a cathode, wherein said layer structure consists of a single organic layer, optionally an electrode modifying layer between the single organic layer and the anode, and optionally an inorganic electrode modifying layer between the single organic layer and the cathode, wherein the single organic layer comprises a hole transporter, an electron transporter and a light emitter, and wherein a compound is present in the single organic layer, which compound acts as an electron transporter and light emitter and is of general Formula I:

Formula I wherein

is selected from the following:

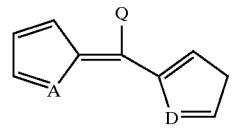

wherein A and D are both N, and the ring systems are, independently of each other, optionally substituted with one or two or three groups independently selected from C1–C8 straight chain or branched chain alkyl or alkoxy; Q is CN or H or $C_{1-8}$ straight chain or branched chain alkyl.

13. An organic light emitting diode device comprising a substrate bearing a layer structure between an anode and a cathode, wherein said layer structure consists of a single organic layer, optionally an electrode modifying layer between the single organic layer and the anode, and optionally an inorganic electrode modifying layer between the single organic layer and the cathode, wherein hole transport, electron transport and light emitting functions are provided by the single organic layer, and wherein in the single organic layer there is present as an electron transporter and a light emitter a compound of general Formula I,

Formula I wherein

is selected from the following:

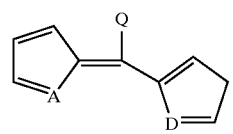

wherein A and D are both N, and the ring systems are, independently of each other, optionally substituted with one or two or three groups independently selected from C1–C8 straight chain or branched chain alkyl or alkoxy; Q is CN or H or $C_{1-8}$ straight chain or branched chain alkyl;

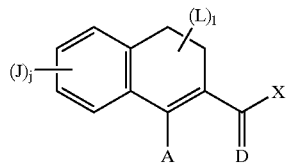

wherein A and D are O or N, X is $C_{1-5}$ straight chain or branched chain alkyl or alkoxy and the ring systems are, independently of each other, optionally substituted with one or more groups J and L independently selected from C1–C8 straight chain or branched chain alkyl or alkoxy wherein j is selected from 0–4 and l is selected from 0–2;

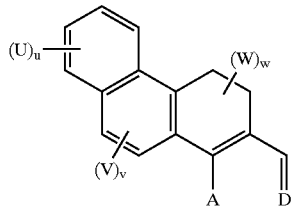

wherein A and D are O or N and the ring systems are, independently of each other, optionally substituted with one or more groups U, V, W independently selected from C1–C8 straight chain or branched chain alkyl or alkoxy wherein u is 0–4, v is 0–2 and w is 0–2.

* * * * *